United States Patent [19]
Lin

[11] Patent Number: 6,071,653
[45] Date of Patent: Jun. 6, 2000

[54] METHOD FOR FABRICATING A PHOTOMASK

[75] Inventor: Benjamin Szu-Min Lin, Chiayi, Taiwan

[73] Assignee: United Microelectronics Corp., Hsinchu, Taiwan

[21] Appl. No.: 09/186,130

[22] Filed: Nov. 4, 1998

[51] Int. Cl.[7] .................................................. G03F 9/00
[52] U.S. Cl. ............................................................ 430/5
[58] Field of Search .............................. 430/5, 322, 324

[56] References Cited

U.S. PATENT DOCUMENTS

| | | | |
|---|---|---|---|
| 5,536,606 | 7/1996 | Doan | 430/5 |
| 5,698,349 | 12/1997 | Yang | 430/5 |

*Primary Examiner*—S. Rosasco
*Attorney, Agent, or Firm*—Thomas, Kayden, Horstemeyer & Risley

[57] ABSTRACT

A method for fabricating a photomask includes forming an anti-reflection layer on a transparent substrate. A transparent layer is formed on the anti-reflection layer. Patterning the transparent layer forms a transparent bar layer so that a portion of the ant-reflection layer is exposed. An opaque layer is formed over the substrate. A polishing process is performed to polish the opaque layer and the transparent bar layer so that a top portion of the transparent bar layer is polished and exposed. An etching back process is performed to remove a portion of the opaque layer so that the anti-reflection layer is exposed and the remains of the opaque layer forms a spacer with uniform thickness on each side of the transparent bar layer. The transparent bar layer is removed by etching so as to form the photomask.

23 Claims, 3 Drawing Sheets

METHOD FOR FABRICATING A PHOTOMASK

BACKGROUND OF THE INVENTION

1. Field of the Invention

This invention relates to semiconductor fabrication, and more particularly to a method for fabricating a photomask, which has a pattern including a narrow line width and a small pitch between lines.

2. Description of Related Art

In a photolithography process, photomask is the main tool to transfer a circuit pattern onto a wafer so that the photomask plays an essential role in semiconductor fabrication. The main part of the photomask is a transparent substrate and is planar. A circuit pattern is formed by an opaque layer, which includes a desired pattern to cover a portion of the transparent substrate. When the photomask is exposed to a light source, a circuit pattern is projected onto the wafer. As the integration of a device increases, the photomask needs a narrower line width to satisfy the reduced device dimension.

FIG. 1A and FIG. 1B are cross-sectional views of a photomask, schematically illustrating a conventional fabrication process of the photomask. In FIG. 1A, a typical photomask includes a transparent substrate 10, which is made of glass or quartz. An anti-reflection layer 12 is formed over the transparent substrate 10. An opaque layer 14 is formed over the anti-reflection layer 12 by chemical vapor deposition (CVD). The opaque layer 14 includes, for example, chromium, ion oxide, silicon nitride, or aluminum. The light transmission of the opaque layer 14 is about 10%–35%. In FIG. 1B, according to a desired pattern, the opaque layer 14 is patterned to form a transparent region 18 and an opaque region 16. A photomask is thereby formed.

However, since the transparent region 18 and the opaque region 16 are formed by photolithography and etching, their spatial resolution is limited by equipment capability of photolithography. This causes the line with of pattern to be limited and not to be reduced. This is a problem for semiconductor fabrication in the next generation, which has greater integration.

SUMMARY OF THE INVENTION

It is therefore an objective of the present invention to provide a method for fabricating a photomask, which has a narrower line width and a smaller pitch between pattern lines.

In accordance with the foregoing and other objectives of the present invention, a method for fabricating a photomask is provided. The method of the invention includes an anti-reflection layer formed over a transparent substrate. A transparent layer is formed on the anti-reflection layer. A transparent bar layer is formed by removing a portion of the transparent layer so that a portion of the anti-reflection layer is exposed. An opaque layer is formed over the transparent substrate so that the ant-reflection layer and the transparent bar layer are covered by the opaque layer. A polishing process is performed to polish the opaque layer and the transparent bar layer so that the remaining opaque layer forms a spacer with a uniform thickness on each sidewall of the transparent bar layer. In order to obtain the spacer, there are two ways. The first way, for example, is performing an etching back process to remove the opaque layer so as to expose the transparent bar layer and the anti-reflection layer. A remains of the opaque layer form a spacer on each side of the transparent bar layer. A polishing process is preferably performed to remove a top portion of the transparent bar layer and the spacer so as to obtain the spacer with uniform thickness. The second way, for example, is performing a polishing process to polish the opaque layer and the transparent bar layer so that the transparent bar layer is exposed. An etching back process is performed to remove a portion of the opaque layer so that the anti-reflection layer is exposed, and the remains of the opaque layer with uniform thickness on each side of the transparent bar layer is formed. After the spacer is formed, the transparent bar layer is removed by, for example, etching. The spacer forms an opaque layer on the transparent substrate with narrower line width and smaller pitch between lines.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2A:
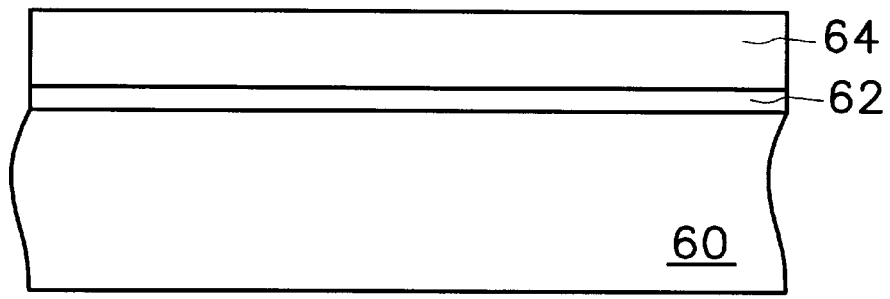
FIGS. 2A–2F are cross-sectional views of a photomask, schematically illustrating a fabrication process of the photomask, according to a preferred embodiment of the invention.

FIGS. 2A–2F are cross-sectional views of a photomask, schematically illustrating a fabrication process of the photomask, according to a preferred embodiment of the invention. In FIG. 2A, a transparent substrate 60 including, for example, quartz or silicon glass is provided. The choice of material depends on the wavelength of a light source. An anti-reflection layer 62 is formed over the transparent substrate 60. The anti-reflection layer 62 includes, for example, $CrO_2$ and is used to prevent a light reflection during a subsequent metallization process. A transparent layer 64 is formed over the anti-reflection layer 62. The transparent layer 64 includes, for example, silicon oxide and is formed by, for example, chemical vapor deposition (CVD).

Figure 2B:
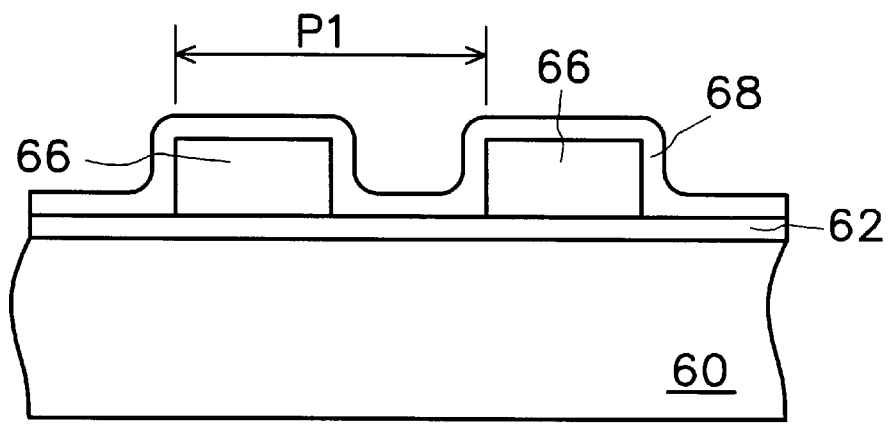

In FIG. 2B, the transparent layer 64 is patterned to form a transparent bar layer 66. A portion of the anti-reflection layer 62 is exposed. An opaque layer 68 is formed over the transparent substrate 60 so that the anti-reflection layer 62 and the transparent bar layer 66 are covered by the opaque layer 68. The formation of the opaque layer 68 includes, for example, CVD. The opaque layer 68 includes, for example, chromium, iron oxide, silicon nitride, or aluminum. A pitch $P_1$ is the distance between two transparent bars.

A polishing process is performed to polish the opaque layer and the transparent bar layer so that the remaining opaque layer forms a spacer with a uniform thickness on each sidewall of the transparent bar layer.

Figure 1A:
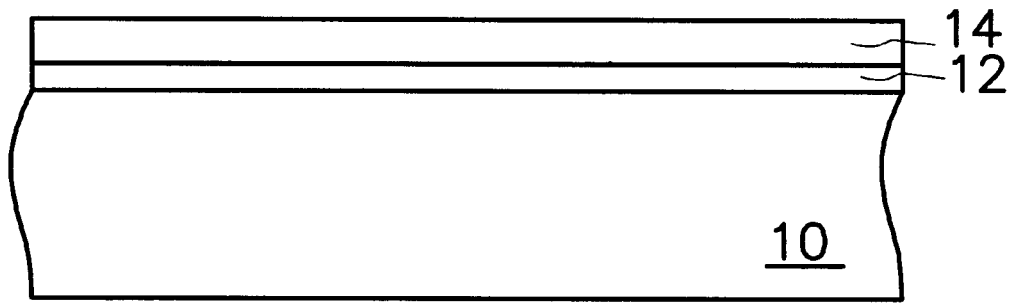
FIG. 1A and FIG. 1B are cross-sectional views of a photomask, schematically illustrating a conventional fabrication process of the photomask.
Figure 1B:
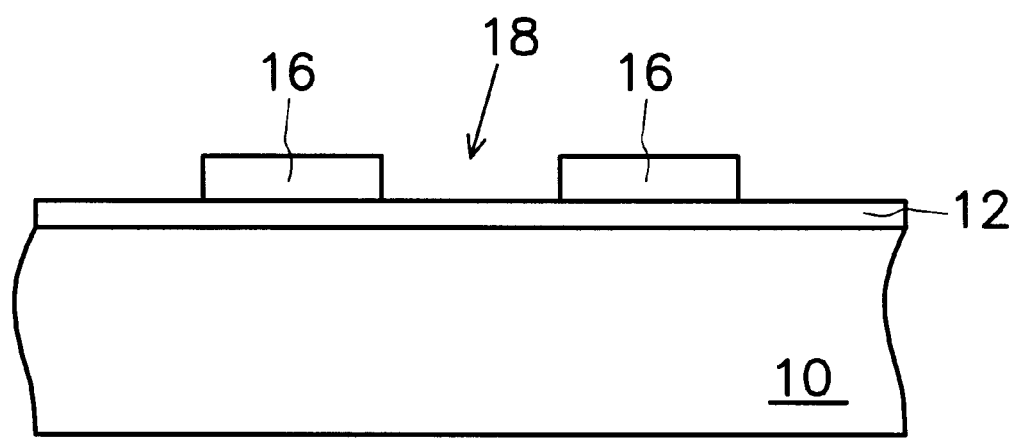
Figure 2C:
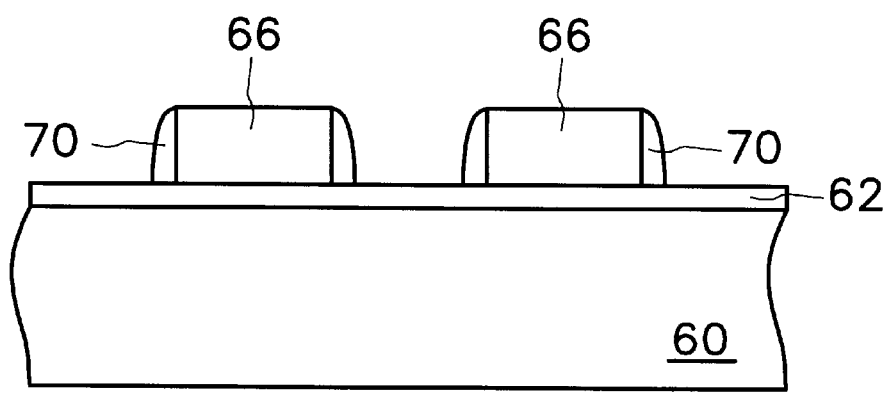
Figure 2D:
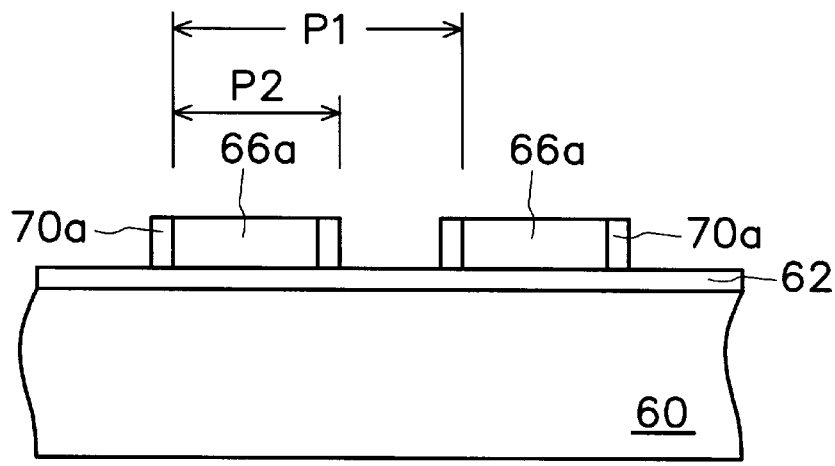

In FIG. 2C, in order to obtain the spacer with uniform thickness, an etching back process is performed to etch the opaque layer 68. The etching back process includes, for example, dry etching. The transparent bar layer 66 and the anti-reflection layer 62 are exposed. The remains of the opaque layer 68 forms a spacer 70 on each side of the transparent bar layer 66. In FIG. 2C and FIG. 2D, a polishing process, such as a chemical mechanical polishing (CMP) process, is performed to remove the top portion of the spacer 70 and the transparent bar layer 66 so as to obtain a spacer 70a with a uniform thickness on each sidewall of the of a transparent bar layer 66a. The spacer 70a serves as a pattern layer with a narrower line width, which is the thickness of the spacer 70a. The pitch P2 between the spacers 70a is smaller than the pitch P1 between bars of the transparent bar layer 66a. The transparent bar layer 66a is the opaque region 16 of FIG. 1B. The transparent bar layer 66a usually is preferably removed by, for example, etching to form a photomask. Here, the transparent bar layer 66a can also includes some opaque materials. In this manner, the transparent bar layer 66a is necessary to be removed by, for example, etching. The spacer 70a is still formed over the transparent substrate 60 serving as the pattern layer.

Figure 2E:
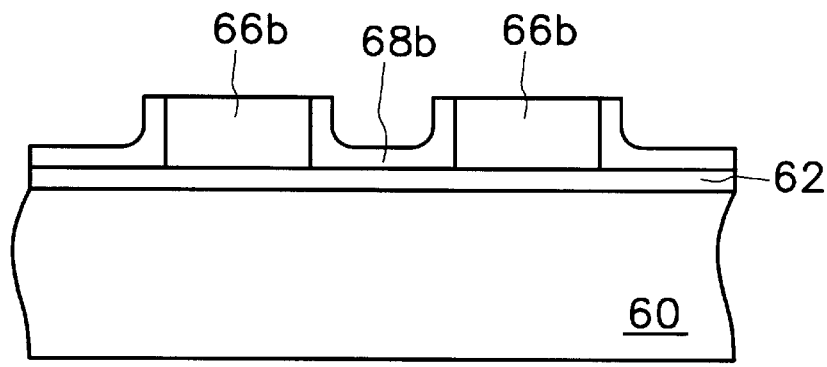
Figure 2F:
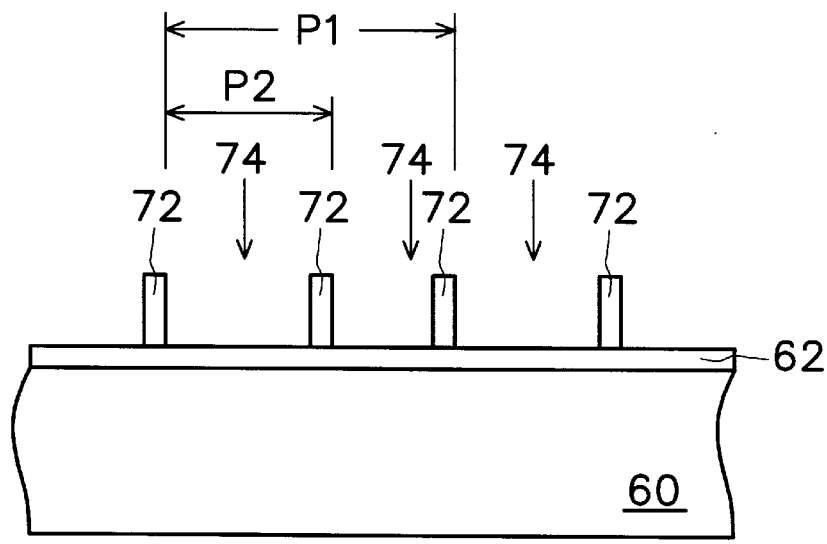

An alternative method to obtain a feature like FIG. 2D is following. The method starts from FIG. 2C. In FIG. 2C and FIG. 2E, a polishing process, such as a CMP process, is performed to remove the top portion of the opaque layer 68 on the top of the transparent bar layer 66, of which a top portion may also be removed. The opaque layer 68 and the transparent bar layer 66 respectively become an opaque layer 68b and a transparent bar layer 66b. In FIG. 2F, an etching back process is, for example, performed to remove the opaque layer 68b at a portion on the anti-reflection layer 62 so that the anti-reflection layer 62 is exposed and the remains of the opaque layer 68b becomes a spacer 72 with uniform thickness on each side of the transparent bar layer 66b. The transparent bar layer 66b is preferably removed and leaves an opening region 74, which exposes the anti-reflection layer 62. The process to remove the transparent bar layer 66b includes, for example, an etching process. The spacer 72 serves as a pattern layer with a narrower line width, which is the thickness of the spacer 72. The pitch P2 between the spacers 72 is smaller than the pitch P1 between bars of the transparent bar layer 66b. The transparent bar layer 66b is the opaque region 16 of FIG. 1B. Here, the transparent bar layer 66b can also include some opaque materials. In this manner, the transparent bar layer 66b is necessary to be removed by, for example, etching. The spacer 72 is still formed over the transparent substrate 60, serving as the pattern layer.

If the transparent bar layer 66a of FIG. 2D is removed, the photomask also becomes the one of FIG. 2F. The spacer width, that is, the line width can be as small as a few tens angstroms, which is much narrower than the conventional width of the opaque region 16 of FIG. 1B.

The invention has several advantages as follows:

1. The uses forming the spacer 72 to serve as lines of pattern so that the line width and the pitch P2 between lines are greatly reduced. This improved photomask is extremely helpful to reduce device dimension.

2. The improved photomask of the invention is suitable for any design type of photomask, and particularly suitable for binary photomask and half-tone photomask.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a photomask, the method comprising:

provoding a transparent substrate;

forming a bar layer covering a predetermined area of the transparent substrate;

forming an opaque layer overlying the bar layer and the transparent substrate;

removing a portion of the opaque layer to expose the upper surface of the bar layer and the transparent substrate, wherein the remaining opaque layer forms a spacer on a sidewall of the bar layer; and removing the bar layer.

2. The method of claim 1, wherein the bar layer comprises silicon oxide.

3. The method of claim 1, wherein the step of removing the portion of the opaque layer comprises the steps of:

removing a portion of the opaque layer until the substrate is exposed;

polishing away top portions of the bar layer and the opaque layer until the remaining opaque layer possesses an uniform thickness.

4. The method of claim 3, wherein the step of polishing away the top portions of the spacer and the bar layer comprises a chemical mechanical polishing (CMP) process.

5. The method of claim 1, wherein the method further comprises forming an anti-reflection layer over the substrate before the step of forming the bar layer.

6. The method of claim 5, wherein the anti-reflection layer comprises $CrO_2$.

7. The method of claim 1, wherein the substrate comprises quartz or silicon glass.

8. The method of claim 1, wherein the step of forming the material layer comprises chemical vapor deposition (CVD).

9. The method of claim 1, wherein the step of forming the opaque layer comprises CVD.

10. The method of claim 1, wherein the step of removing the portion of the opaque layer comprises an etching process.

11. The method of claim 1, wherein the step of removing the bar layer comprises an etching process.

12. A method for fabricating a photomask, the method comprising:

providing a transparent substrate;

forming a material layer over the substrate;

patterning the material layer to form a bar layer exposing a portion of the substrate;

forming an opaque layer over the substrate;

polishing away a portion of the opaque layer to expose a top surface of the bar layer;

removing another portion of the opaque layer to expose the substrate, wherein the remaining opaque layer forms a spacer on a sidewall of the bar layer and serves as a pattern layer on the substrate; and removing the bar layer.

13. The method of claim 12, wherein the material layer comprises silicon oxide.

14. The method of claim 12, wherein before the step of forming the material layer, the method further comprises forming an anti-reflection layer over the substrate.

15. The method of claim 14, wherein the anti-reflection layer comprises $CrO_2$.

16. The method of claim 12, wherein the substrate comprises quartz or silicon glass.

17. The method of claim 12, wherein the step of forming the material layer comprises chemical vapor deposition (CVD).

18. The method of claim 12, wherein the step of removing the another portion of the opaque layer comprises an etching back process.

19. The method of claim 12, wherein the step of polishing away the portion of the opaque layer comprises a chemical mechanical polishing (CMP) process.

20. The method of claim 12, wherein the step of removing the bar layer comprises an etching process.

21. A method for manufacturing a photomask, comprising the steps of:

proving a transparent substrate;

forming a patterned transparent layer on the transparent substrate;

forming an opaque layer on the patterned transparent layer and the transparent substrate;

removing a portion of the opaque layer to expose a portion of the transparent substrate, wherein the remaining opaque layer on the transparent substrate forms as a bar-type opaque layer at a sidewall of the patterned transparent layer and possesses an uniform thickness; and removing the patterned transparent layer.

22. The method of claim 21, wherein the step of removing the portion of the opaque layer comprises the steps of:

performing an etching process to remove a portion of the opaque layer to expose the portion of the transparent substrate; and performing a chemical-mechanical polishing process on the remaining opaque layer and the patterned transparent layer until the thickness of the remaining opaque layer is uniform.

23. The method of claim 21, wherein the step of removing the portion of the opaque layer comprises the steps of:

performing a chemical-mechanical polishing process to remove a portion of the opaque layer until the top surface of the patterned transparent layer is exposed; and performing an etching process to remove a portion of the opaque layer until a portion of the transparent substrate is exposed.

* * * * *